United States Patent [19]
Banker et al.

[11] Patent Number: 4,746,817
[45] Date of Patent: May 24, 1988

[54] BIFET LOGIC CIRCUIT

[75] Inventors: Dennis C. Banker, Newburgh; Allan H. Dansky, Poughkeepsie; Jack A. Dorler, Holmes; Walter S. Klara, Hopewell Junction; Frank M. Masci, Wappingers Falls; Steven J. Zier, Hopewell Junction; Adrian Zuckerman, Poughkeepsie, all of N.Y.

[73] Assignee: International Business Machines Corporation, Armonk, N.Y.

[21] Appl. No.: 26,229

[22] Filed: Mar. 16, 1987

[51] Int. Cl.$^4$ .................... H03K 17/04; H03K 19/01
[52] U.S. Cl. .................... 307/446; 307/443; 307/451; 307/570
[58] Field of Search ............... 307/443, 446, 448, 451, 307/454, 475, 570, 306

[56] References Cited
U.S. PATENT DOCUMENTS

| | | | |
|---|---|---|---|
| 3,541,353 | 9/1967 | Seelbach et al. | 307/246 |
| 3,879,619 | 4/1975 | Pleshko | 307/251 |
| 4,356,416 | 10/1982 | Weischedel | 307/570 |
| 4,458,234 | 12/1985 | Suzuki et al. | 307/446 |
| 4,612,458 | 9/1986 | Vasseghi et al. | 307/446 |
| 4,616,146 | 10/1986 | Lee et al. | 307/446 |
| 4,638,186 | 1/1987 | McLaughlin | 307/446 |
| 4,649,295 | 3/1987 | McLaughlin et al. | 307/446 |
| 4,678,943 | 7/1987 | Uragami et al. | 307/446 X |
| 4,694,202 | 9/1987 | Iwamura et al. | 307/446 X |

FOREIGN PATENT DOCUMENTS

| | | | |
|---|---|---|---|
| 0099100 | 1/1984 | European Pat. Off. | 307/446 |
| 0045207 | 3/1980 | Japan | 307/446 |
| 0019435 | 1/1984 | Japan | 307/446 |
| 0196625 | 11/1984 | Japan | 307/446 |
| 0141018 | 7/1985 | Japan | 307/446 |

OTHER PUBLICATIONS

"Low Power, High Performance, Complementary FET-DTL and FET Logic Circuits", *IBM TDB*, vol. 29, No. 2, Jul. 1986, pp. 731-732.
"High Impedance Bipolar Inverter Circuit", *IBM TDB*, vol. 29, No. 3, Aug. 1986, p. 1271.
Watanabe et al, High Speed BICMOS VLSI Technology . . . IEDM 85 p. 423.

*Primary Examiner*—Stanley D. Miller
*Assistant Examiner*—D. R. Hudspeth
*Attorney, Agent, or Firm*—William T. Ellis

[57] ABSTRACT

A BIFET logic circuit for quickly switching an output line from a high level to a reference level. The BICMOS circuit comprises a push-pull circuit including a first bipolar transistor for driving current into an output line, and a second bipolar transistor for sinking current from the output line; a CFET logic circuit for performing a logic function and including at least one N type FET for providing current to the base of the second bipolar transistor when a set of input lines to the CFET circuit has a first set of predetermined values; and a resistive means for connecting one of the source or drain of the at least one NFET to a power supply to provide a source of base current to the second bipolar transistor, even when the output line drops in voltage. This circuit is especially advantageous for driving low threshold CFET circuits. In a preferred embodiment, the circuit further includes a device for preventing a voltage differential of more than a predetermined amount between the base and emitter of the first bipolar transistor, to thereby ensure proper push-pull operation of the bipolar transistors.

30 Claims, 2 Drawing Sheets

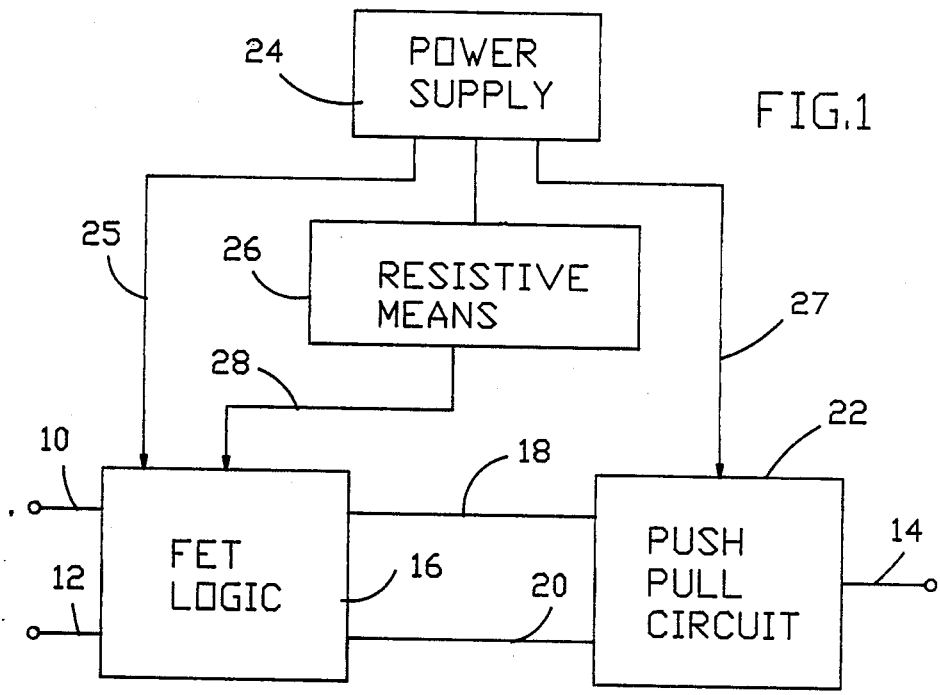
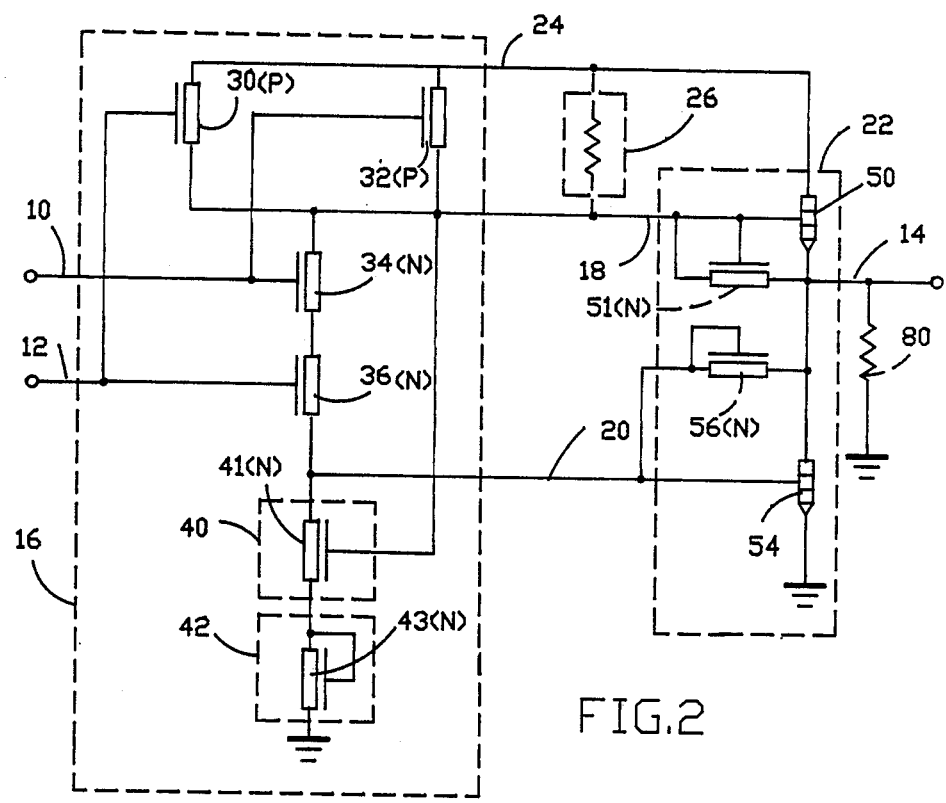

BIFET LOGIC CIRCUIT

BACKGROUND OF THE INVENTION

The present invention relates generally to semiconductor integrated logic circuits and, more particularly, to a BIFET logic circuit with fast switching and low power dissipation.

Advances in semiconductor processing technology have provided the ability to fabricate large numbers of active devices on a single chip. Bipolar transistors are the preferred active devices for such chips because of their fast switching speeds, reduced delay per unit load, and ability to drive large capacitive loads due to their high current gain. In particular, during transient periods the bipolar current gain allows the fast charging and discharging of capacitive loads, resulting in high switching speeds and decreased fanout delays.

However, the limiting factor preventing the design of a bipolar chip with more than 20,000 circuits is power dissipation. The few low power (less than 200 microwatt) bipolar circuits available are slow and difficult to implement due to high resistance values.

In order to obviate the power dissipation problem, logic functions are now being designed to use CFET (complementary field effect transistor) circuits, with their attendant low power consumption, in combination with a bipolar push-pull driver output circuit. This combination, referred to as a BIFET or BICMOS circuit, utilizes the high noise immunity, high input impedance, and low power consumption characteristics of the FET to perform the actual logic function, while obviating the FET's low transconductance and poor ability to drive heavy capacitive loads by using a bipolar driver output circuit.

A typical CFET logic circuit utilizes one or more P type FETs connected in one of either a series or a parallel connection, which, in turn, is connected in series to one or more N type FETs connected in the other of either a series or a parallel connection. Each input line is connected to the gate of a different P type FET and to the gate of a different N type FET. Output lines from this CFET logic circuit are connected to drive base currents for a first bipolar transistor connected to source current on an output line, and a second bipolar transistor connected to sink current from the output line.

In most prior art circuits of this type, the N FETs are connected between the output line and the second transistor base. This connection, in combination with the NFET connection to the power supply through the PFETs, provides the base current to the second bipolar transistor to thereby sink current from the output line when these N FETs are conducting. For example, see U.S. Pat. No. 4,616,146.

However, it has been discovered that during a switching of the output line from a high voltage, for example 3 volts, to a low voltage close to ground, the above-recited circuit connection causes an initial fast voltage drop on the output line to approximately 0.7 volts, followed by a very slow drop from 0.7 volts to approximately ground. This slow voltage drop period is due to the fact that the base current for the current sinking second bipolar transistor, after the P FETs stop conducting, is actually coming from the output line itself, which line has already sunk a large portion of its capacitive charge during the initial fast voltage drop. In essence, when the output voltage drops to approximately 0.7 volts, the base of the current sinking second transistor also drops to 0.7 volts (since the NFETs connected from the base to the output line are on and the NFET source cannot have a higher voltage than its drain). Therefore, this second transistor turns off (a $V_{BE}$ below 0.7 volts is not sufficient to maintain the transistor in conduction) causing the collector current to go to zero. Thus, the second transistor. Also, as the output line drops no longer provides a sink for the capacitive current of the output line, and the output voltage cannot continue to drop quickly below 0.7 volts. Thus, the circuit must rely on leakage currents through the second bipolar transistor to sink the remainder of the capacitive charge on the output line to thereby drop the output line to approximately ground potential.

This slow output line voltage drop from 0.7 volts to ground makes this circuit output line unsuitable for driving low-threshold CFET circuits because, during a portion of this slow voltage drop, both the P and N type FETs are conductive in the following CFET circuit, causing a low impedance connection between Vcc & ground. In this regard, the voltage range above the 0.4 volts $V_{GS}$ threshold for a typical N type FET, and below the 0.6 volt $V_{SG}$ threshold for a typical P type FET, causes both types of devices to be conductive. Accordingly, the slow voltage drop through this 0.4–0.6 voltage range causes a substantial power dissipation in any CFET circuit being driven by the output line.

Additionally, most prior art BIFET circuits of the type described require two bipolar transistors, plus at least three times the circuit fan-in of FETs, plus an additional FET, in order to implement their logic. However, as the circuit fan-in becomes large, the active device count for such a circuit becomes prohibitive.

The invention as claimed is intended to remedy the above-described problems.

The advantage offered by the present invention is a high speed switching of the output line down to a reference potential which may be close ground potential. Accordingly, the circuit of the present invention can be used to directly drive low-threshold CFET circuits. Additionally, the circuit of the present invention utilizes an active device count of two times the circuit fan-in plus two FETs, plus the two bipolar transistors. This reduced active device count is a significant advantage as the circuit fan-in increases.

SUMMARY OF THE INVENTION

Briefly, the present invention is directed to a high speed switching logic circuit for BIFET circuits, comprising:

at least one input line and an output line;

a CFET logic circuit for generating signals on a first and a second control lines in accordance with the signal values on the at least one input line;

a push-pull circuit formed of bipolar transistors for driving current into the output line if the first control line thereto is in a predetermined value range, and for sinking current from the output line if the second control line is in a predetermined value range;

a power supply; and resistive means for connecting the power supply to provide current of a desired polarity through the CFET logic circuit to the second control line to thereby cause the push-pull circuit to sink current from the output line, even after the output line drops in voltage.

In one embodiment of the present invention, the push-pull circuit comprises a first bipolar transistor for driving current into the output line when conductive, and having its base connected to the first control line; a second bipolar transistor for sinking current from the output line when conductive, with its base connected to the second control line; and means for preventing the second bipolar transistor from saturating.

In a further embodiment of the present invention, the CFET logic circuit comprises at least one first FET of one type for generating the first control signal to have its predetermined value range when the at least one input line has a first value; and at least one second FET of a different type for generating the second control signal to have its predetermined value range when the at least one input line has a second value; and wherein the resistive means is connected between the power supply and the drain or the source of the at least one second FET.

In a preferred embodiment, the CFET logic circuit comprises a feedback circuit for bringing the second control line to a value to prevent current sinking in the push-pull circuit when the first control line is in its predetermined value range; and means for preventing the feedback circuit from operating when the second control line is in its predetermined value range.

In yet a further embodiment, a device is connected across the base and emitter terminals of the first bipolar transistor in order to prevent a voltage differential of more than a predetermined amount between the first control line and the emitter of the first bipolar transistor. This connection prevents a dropping emitter voltage on the first bipolar transistor from maintaining that transistor conductive as the second bipolar transistor becomes conductive.

In yet a further embodiment, the at least one first FET and the at least one second FET are each connected at one terminal to the first control line and are in series.

BRIEF DESCRIPTION OF THE DRAWINGS

FIG. 1 is a schematic block diagram of one embodiment of the present invention.

FIG. 2 is a schematic circuit diagram of one embodiment of a NAND gate in accordance with the present invention.

DETAILED DESCRIPTION OF THE PREFERRED EMBODIMENT

Figure 3:
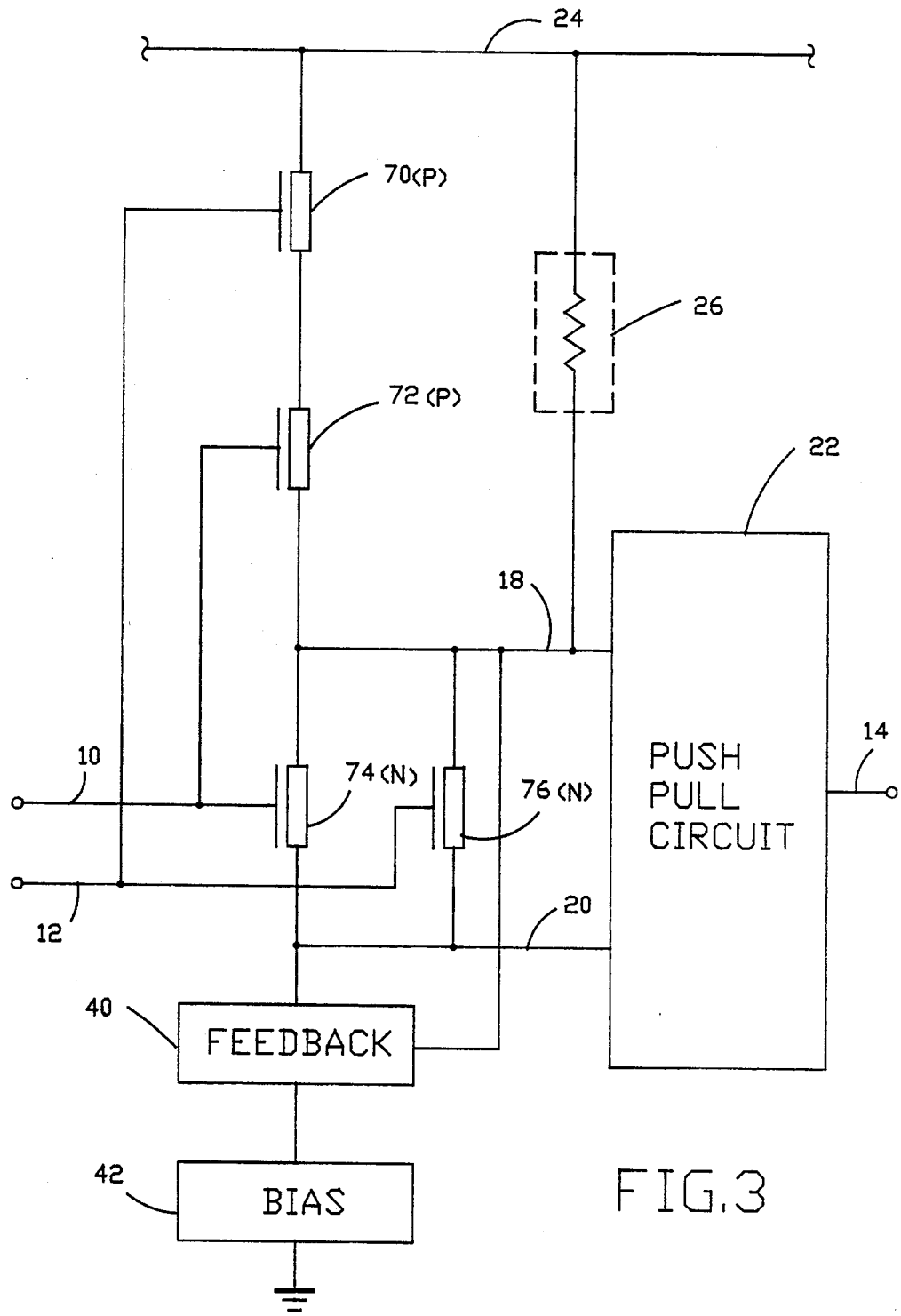
FIG. 3 is a schematic circuit diagram of one embodiment of a NOR logic circuit in accordance with the present invention.

Referring now to FIG. 1, one embodiment of the present invention is shown in block diagram form. The circuit of FIG. 1 includes two input lines 10 and 12, and an output line 14. Note that only one input line would be used if an INVERT function was to be implemented. A CFET logic circuit 16 (typically a CMOS circuit) receives signals from the two input lines 10 and 12 and generates a first control signal on line 18 and a second control signal on line 20 in accordance with the signal values on the input lines 10 and 12. The circuit further includes a push-pull circuit 22, formed of bipolar transistors, for driving current into the output line 14 if the first control line 18 is in a first predetermined value range, and for sinking current from the output line 14 if the second control line 20 is in a second predetermined value range. The circuit further includes a power supply 24 which is connected to the FET logic 16 via the line 25 and to the push-pull circuit 22 via the line 27, and a resistive means 26 for connecting the power supply to provide current of a desired polarity through the CFET logic circuit via line 28, to the second control line 20. This current from line 28 causes the push-pull circuit 22 to sink current from the output line 14, even after the output line 14 drops in voltage.

The FET logic circuit 16 may be utilized to implement a variety of different logic functions, such as, for example, the NAND function, the NOR function, the INVERT function, the AND-OR-INVERT function, and the OR-AND-INVERT function. In order to further illustrate the operation of the present invention, and not by way of limitation, the invention will be discussed in the context of a NAND logic circuit 16.

Referring now to FIG. 2, a NAND function is implemented in the FET logic circuit 16. This NAND function is obtained by connecting the first and second input lines 10 and 12 to the gates of a first set of FETs 30 and 32 of one type, for generating the first control signal on the first control line 18 to have the first predetermined value range when the two input lines have a first set of predetermined values. The first and second input lines 10 and 12 are also connected to the gates of a second set of FETs 34 and 36, of a different type, for generating the second control signal on the second control line 20 to have the second predetermined value range when the two input lines 10 and 12 have a second set of predetermined values. The resistive means 26, in this case simply a resistor, is connected between the power supply 24 and the drain or source of at least one FET (FET 34 in this configuration) in the second set of FETs.

In the specific embodiment shown in FIG. 2, the first set of FETs 30 and 32 comprise at least two P type FETs connected in a parallel circuit, with one end of the parallel circuit connected to the power supply bus 24, and with the other end of the parallel circuit connected to the first control line 18. Each of the input lines 10 and 12 is connected to a different one of the PFET gates. The second set of FETs comprise at least two N type FETs 34 and 36 connected in a series circuit, with one end of the series circuit connected to the first control line 18, and with the other end of the series circuit connected to the second control line 20. Each of the input lines 10 and 12 is connected to a different one of the NFET gates.

The logic circuit 16 further includes a feedback circuit 40 for bringing the second control line 20 to a value sufficient to prevent current sinking in the push-pull circuit 22 when the first control line 18 is in its first predetermined value range. The logic circuit 16 further includes means 42 for preventing the feedback circuit 40 from operating when the second control line 20 is in its second predetermined value range. In the embodiment shown in FIG. 2, the feedback circuit 40 is simply implemented by an N type FET 41 connected between the second control line 20 and the preventing means 42. The preventing means 42 is simply implemented by an N type FET 43 with its gate and drain connected together to form a diode, and with its source connected to a reference potential, such as ground potential.

The push-pull circuit 22 in the embodiment of FIG. 2 is shown to include a first bipolar transistor 50 for driving current into the output line 14 when conductive, and having its base connected to the first control line 18. The push-pull circuit also includes a second bipolar transistor 54 for sinking current from the output line 14 when conductive, with its base connected to the second control line 20. Means 56 is included in the circuit for preventing the second bipolar transistor 54 from saturating. In the embodiment of FIG. 2, this saturation prevention means 56 simply comprises an N channel FET 56 with its gate and drain connected to the base, and with its source connected to the collector of the second bipolar transistor 54, in the well known manner. The N channel FET diode 56 turns on and conducts current only when the voltage on the output line 14 (the collector of the second bipolar transistor 54) drops down in voltage low enough (approximately 0.1 volts) so that the base-to-collector voltage across the NFET diode 56 is above the voltage threshold for that diode. Note that the use of this anti-saturation device with the current sinking second transistor is generally not present in the prior art BICFET circuits of this type because prior art circuits have the base and collector of the second bipolar transistor shorted through one or more active devices.

The resistive means 26 may be implemented in a variety of different configurations, with the resistor shown in FIG. 2 being the least complicated. A convenient method for implementing this simple resistor is by using polysilicon over silicon. Typically, the resistance value for the resistive means is chosen empirically. One value of resistance that could be used is 1 megaohm, which would draw a current of approximately 2 μa.

Note that a resistor 80 may be connected between the output line 14 and the reference potential, if a predetermined driver current is desired.

The operation of the circuit embodiment shown in FIG. 2 will now be described. It will be assumed, for purposes of this description, that the threshold voltage for the N type FETs is $V_{GS}=0.4$ volts, and the threshold voltage for the P type FETs is $V_{GS}=-0.9$ volt.

Initially, assume that one of the two input lines 10 and 12 has a LOW voltage input, while the other input line has a HIGH voltage input. For example, assume that input line 10 is at a voltage of 0 volts, while input line 12 is at 2.7 volts, with a power supply voltage of 3.40 volts. In this instance, the gate-to-source voltage for the P type FET 32 is $-3.40$ volts, which is below the $V_{GS}$ conducting threshold ($-0.9$ V) for P type devices. Thus, FET 32 conducts and the voltage on the first control line 18 is HIGH (approximately 3.4 volts), and the current driving bipolar transistor 50 conducts. The conducting bipolar transistor 50 drives current on the output line 14 and, due to its emitter-follower action, raises the voltage on line 14 to 0.7 volts below its base voltage, or 2.7 volts. Note that the N type FET 42 for the feedback means 40 conducts because its gate voltage of 3.4 volts provides a gate-to-source voltage drop which is above the 0.4 volts $V_{GS}$ threshold for N type FETs. Although the diode 43 raises the source terminal voltage for the NFET 41 to 0.5 volts, this source voltage increase does not prevent the turn-on of NFET 41. Accordingly, the second control line 20 is connected essentially to a low voltage close to ground potential. The HIGH voltage on line 12 causes a sufficient gate-to-source voltage drop to bias NFET 36 into conduction. However, NFET 34 remains nonconductive because of the LOW voltage on input line 10. Accordingly, no current flows through the NFETs 34 and 36 into the second control line 20, and to the base of the bipolar transistor 54, so that transistor 54 remains nonconductive.

Assume now that the voltage on input line 10 rises to 2.70 volts (HIGH) so that NFET 34 turns on. The gate-to-source voltage for PFET 32 rises to approximately $-0.7$ volts (above the $V_{GS}=-0.9$ V threshold) and the PFET 32 becomes nonconductive. Since both PFET 30 and 32 are now nonconductive and NFETS 34 and 36 are conductive, the voltage on the first control line 18 drops to 0.68 volts, which is sufficiently below the threshold for the first bipolar transistor 50 to make that transistor nonconductive. This drop in voltage on the first control line 18 to 0.68 volts causes the gate-to-source voltage for NFET 42 to drop below its conducting voltage threshold, so that it stops conducting. Note that the diode 43 makes the voltage at the source for NFET 42 approximately 0.5 volts, thus ensuring that the gate-to-source voltage for NFET 42 is below its conducting threshold when the input lines 10 and 12 are both HIGH.

However, because the input lines 10 and 12 have their gate-to-source voltages biased above their respective conducting thresholds, both conduct. These NFETs provide current to the base of the second bipolar transistor 54. Additionally, because of the source-follower action of NFET 36, the voltage on the second control line 20 rises above the threshold voltage for the second bipolar transistor 54, and it conducts. The conduction of the second bipolar transistor 54 sinks current from the output line 14, causing its voltage to drop.

Initially, as the voltage on input line 10 approaches 2.70 volts, the majority of current (approximately 50 μa) provided through the NFETs 34 and 36 to the base of the second bipolar transistor 54 is from the power supply through PFET 32 (which has not yet turned off). Thus, the bipolar transistor 54 is turned on hard and causes a large capacitive current discharge from the output line 14, with a resultant fast voltage drop. When the PFET 32 turns off, then the transistor 54 base current required to sink the remaining capacitive charge from the output line 14 is provided from the power supply 24, through the resistive means 26, to the NFETs 34 and 36. This current through the resistive means 26 thus allows the voltage on the output line 14 to quickly drop from approximately 0.7 volts to 0.1 volts. Also, this 0.1 volt output is maintained by a dc or steady state base current supplied to the bipolar transistor 54 by the resistive means 26. This 0.1 volts on the output line 14 is sufficient to ensure that only one type of FET in the CMOS circuits driven from line 14 is conductive, thereby controlling power dissipation.

In contrast, prior art circuits do not utilize a resistive means 26, but rather tie their NFET series circuit to the output line 14. Accordingly, after the initial discharge of current from the output line 14, there is not sufficient base current available from output line 14 to maintain the second bipolar transistor 54 in conduction. Thus, the voltage on the output line of such prior art circuit drops very slowly toward ground potential after the initial fast voltage drop.

Under certain circuit conditions, such as very light electrical loading and a significant internal capacitance on the first control line 18, and if super fast bipolar transistors are utilized as the first and second bipolar transistors 50 and 54, a low impedance path to ground may occur at certain points in the circuit operation. For example, when the voltage on input line 10 goes HIGH, with the voltage on input line 12 already HIGH, then current from the NFETs 34 and 36 is applied on the second control line 20 to turn on the second bipolar transistor 54. Thus, the voltage on the output line 14 (and the emitter of the bipolar transistor 50) begins to drop rapidly. At the same time, the voltage on the first control line 18 begins to drop rapidly as the PFETs 30 and 32 become nonconductive and the NFETs 34 and 36 are conductive. However, as to voltage on the control line 18 drops, the voltage at the emitter of the first bipolar transistor 50 is also dropping, so that there is a short period of when the $V_{BE}$ for the first bipolar transistor 50 continues to be sufficient to maintain that transistor in conduction, while the second bipolar transistor is conducting. This joint conduction results in a current path from the power supply to ground, causing excess power dissipation.

It can be seen that it is desirable to ensure that the voltage on the first control line 18 drops below the $V_{BE}$ cutoff for the first bipolar transistor 50 as the voltage at the emitter of the first bipolar transistor 50 drops. This voltage drop may be accomplished by connecting a device to force the voltage on the first control line 18 to drop in unison with the voltage at the emitter of the bipolar transistor 50. In the embodiment shown in FIG. 2, a diode 51 is used to accomplish this function. For example, the gate and the drain of an FET 51 may be connected to the first control line 18, while its source may be connected to the emitter terminal for the bipolar transistor 50. The FET 51 may have a threshold voltage of 0.5 V, so that it conducts before the bipolar transistor 50, and forces the first control line 18 to follow the emitter voltage. Note that the impedance across the FET 51 ensures that the bipolar transistor 50 can turn on. The use of this device 51 effectively prevents a dropping voltage at the emitter terminal of the first bipolar transistor 50 from maintaining the transistor $V_{BE}$ above its conduction threshold.

It should also be noted that the series connected FETs of the same conductivity type may be realized by using two series-connected sets of FETs, connected in parallel, with each of these FETs having a gate width which is half the width of the original FETs being replaced. The inputs to these FETs would be connected in a first order to one set of the series-connected FETs, and in the reverse order to the other set of series-connected FETs. For example, with respect to FIG. 2, the NFETs 34 and 36 could be replaced by one set of series-connected NFETs 34A and 36A, each with a gate width that is half that of the original NFETs 35 and 36, in combination with another set of series connected NFETs 34B and 36B, with half-width gates. The input line 10 would be connected to the NFETs 34A and 36B, while the input line 12 would be connected to the NFETs 34B and 36A.

This configuration prevents an input line that is physically closer to one control line from pulling that control line HIGH in voltage, due to capacitive effects, before the other control line can be pulled LOW. This configuration causes the voltages on the control lines 18 and 20 to change in time sequence closer to each other, thereby preventing both bipolar transistors from being conductive at the same time. For example, if the input line 10 is already HIGH, and input line 12 goes HIGH, this configuration will prevent the second control line 20 which is physically closer to NFET 36 from going HIGH and making the bipolar transistor 54 conductive, before the voltage on the first control line 18 goes LOW.

Referring now to FIG. 3, there is shown a schematic circuit diagram which implements the present invention in the context of a NOR function. Like-numbered elements in this Figure correspond to like-numbered elements in FIGS. 1 and 2. In this Figure, the NOR function is implemented by a first set of FETs which comprise at least two PFETs 70 and 72 connected in a series circuit, with one end of the series circuit connected to the power supply bus 24, and with the other end of the series circuit connected to the first control line 18. Each of the input lines 10 and 12 is connected to a different one of the PFET gates. The circuit further comprises a second set of at least two NFETs, 74 and 76, connected in a parallel circuit, with one end of the parallel circuit connected to the first control line 18, and with the other end of the parallel circuit connected to the second control line 20. Each of the input lines 10 and 12 is connected to a different one of the NFET gates. The circuit of FIG. 3 also includes the push-pull circuit 22, which is driven by the first and second control lines 18 and 20, the feedback circuit 40 with a feedback line to the first control line 18, and a preventing means 42 connected to the feedback circuit 40. Again, the resistive means 26 is connected between the power supply bus 24 and one of the drain or source of the NFETs 74 and 76.

The circuit of FIG. 3 operates in a similar fashion to FIG. 2. In this regard, the resistive means 26 operates to supply current to one or both of the NFETs 74 and 76, when one of two LOW input lines 10 or 12 goes HIGH. The resistive means 26 thus ensures that the output line 14 is capacitively discharged through the push-pull circuit 22 sufficiently so that its voltage drops to approximately 0.1 volts. Note that when the input voltage on the input lines 10 and 12 are both LOW, then both of the PFETs 70 and 72 are conductive so that the first control line 18 is HIGH, thereby causing the push-pull circuit 22 to drive current into the output line 14. Accordingly, a NOR function is realized by the circuit.

The circuit of FIG. 2 was simulated using ASTAP. For this simulation, the loading conditions were fan-in=2, fan-out=3, and a load capacitance of 0.28 pf. The analysis was performed on a 7-stage chain with the delay averaged across two stages. The power included an AC component and a DC component, with an assumption of 50 mhz for the frequency and a switching factor of 25%. The result of this simulation was a delay of 240 ps and a power of 72 uw at 50 mhz.

The circuit disclosed in the present invention provides a high speed switching of an output line to close to a ground potential by means of a BIFET circuit. Accordingly, the circuit of the present invention can be used to directly drive low-threshold CFET circuits. Additionally, the circuit of the present invention utilizes an active device count of two times the circuit fan-in plus three FETs, plus two bipolar transistors. This reduced device count provides an improved yield for the circuit and allows the circuit to occupy less area, resulting in a smaller chip size and a lower cost.

While the present invention has been particularly shown and described with reference to preferred embodiments therefor, it will be understood by those skilled in the art that the foregoing and other changes in form and detail may be made therein without departing from the spirit and the scope of the present invention, as defined in the appended claims.

We claim:

1. A BIFET circuit, comprising:
   at least one input line and an output line;
   a CFET logic circuit having an input terminal connected to said at least one input line, said CFET logic circuit for generating different signals on a first and a second control lines in accordance with the signal values on said at least one input line;

a push-pull circuit connected to said first and second control lines and formed of bipolar transistors for driving current into said output line if said first control line is in a predetermined value range, and for sinking current from said output line if said second control line is in a predetermined value range;

a power supply; and resistive means for connecting said power supply to provide a current of a desired polarity through said CFET logic circuit to said second control line to thereby cause said push-pull circuit to sink current from said output line even after said output line drops in voltage.

2. A BIFET circuit as defined in claim 1, wherein said push-pull circuit comprises:
  a first bipolar transistor for driving current into said output line when conductive, and having its base connected to said first control line;
  a second bipolar transistor for sinking current from said output line when conductive, with its base connected to said second control line; and
  means connected to said second bipolar transistor for preventing said second bipolar transistor from saturating.

3. A BIFET circuit as defined in claim 2, further comprising:
  means for turning off said first bipolar transistor when said second bipolar transistor becomes conductive.

4. A BIFET circuit as defined in claim 3, wherein said turning off means comprises means for preventing a voltage differential of more than a predetermined amount between said first control line and the emitter of said first bipolar transistor.

5. A BIFET circuit as defined in claim 4, wherein said preventing means comprises a diode connected across said first bipolar transistor base and emitter terminals.

6. A BIFET circuit as defined in claim 1, wherein said CFET logic circuit comprises
  at least one first FET of one conductivity type for generating said first control signal to have said predetermined value range when said at least one input line has a first predetermined value; and
  at least one FET of a different conductivity type for generating said second control signal to have said predetermined value range when said at least one input line has a second predetermined value; and
  wherein said resistive means is connected between said power supply and the drain or source of at least one second FET.

7. A BIFET circuit as defined in claim 6, wherein said at least one first FET of one conductivity type and said at least one second FET of a different conductivity type are connected to said first control line and are connected in series.

8. A BIFET circuit as defined in claim 7, further comprising:
  means for turning off said first bipolar transistor when said second bipolar transistor becomes conductive.

9. A BIFET circuit as defined in claim 8, wherein said turning off means comprises:
  means for preventing a voltage differential of more than a predetermined amount between said first control line and the emitter of said first bipolar transistor.

10. A BIFET circuit as defined in claim 9, wherein said preventing means comprises a diode connected across said first bipolar transistor base and emitter terminals.

11. A BIFET circuit as defined in claim 1, wherein said CFET logic circuit comprises a feedback circuit for bringing said second control line to a value to prevent current sinking in said push-pull circuit when said first control line is in its predetermined value range; and
  means for preventing said feedback circuit from operating when said second control line is in its predetermined value range.

12. A BIFET circuit as defined in claim 11, wherein said push-pull circuit comprises:
  a first bipolar transistor for driving current into said output line when conductive, and having its base connected to said first control line;
  a second bipolar transistor for sinking current from said output line when conductive, with its base connected to said second control line; and
  means connected to said second bipolar transistor for preventing said second bipolar transistor from saturating.

13. A BIFET circuit as defined in claim 11, wherein said at least one input line comprises at least two input lines, and wherein said CFET logic circuit comprises
  a first set of FETs of one conductivity type for generating said first control signal to have said first predetermined value range when said at least two input lines have a first set of predetermined values; and
  a second set of FETs of a different conductivity type for generating said second control signal to have said second predetermined value range when said at least two input lines have a second set of predetermined values; and
  wherein said resistive means is connected between said power supply and the drain or source of at least one FET in said second set of FETs.

14. A BIFET circuit as defined in claim 13, wherein said first set of FETs are P type FETs and said second set of FETs are N type FETs.

15. A BIFET circuit as defined in claim 14, wherein said second set of NFETS are connected in a series circuit, with one end of said series circuit connected to said first control line, and with the other end of said series circuit connected to said second control line, with each of said input lines connected to a different NFET gate.

16. A BIFET circuit as defined in claim 15, wherein said feedback circuit comprises an NFET connected between said second control line and said preventing means; and
  wherein said preventing means includes a diode, with one end connected to a reference potential.

17. A BIFET circuit as defined in claim 16, wherein said first set of FETs comprises at least two PFETs connected in a parallel circuit, with one end of said parallel circuit connected to said power supply, and with the other end of said parallel circuit connected to said first control line, with each of said input lines connected to a different PFET gate.

18. A BIFET circuit as defined in claim 17, further comprising:
  means for preventing a voltage differential of more than a predetermined amount between said first control line and the emitter of said first bipolar transistor.

19. A BIFET circuit as defined in claim 14, wherein said second set of NFETs comprise at least two NFETs connected in a parallel circuit, with one end of said parallel circuit connected to said first control line, and with the other end of said parallel circuit connected to said second control line, with each of said input lines connected to a different NFET gate.

20. A BIFET circuit as defined in claim 19, wherein said feedback circuit comprises an N FET connected between said second control line and said preventing means; and wherein said preventing means includes a diode, with one end connected to a reference potential.

21. A BIFET as defined in claim 12, wherein said first set of FETs comprises at least two PFETs connected in a series circuit, with one end of said series circuit connected to said power supply, and with the other end of said series circuit connected to said first control line, with each of said input lines connected to a different PFET gate.

22. A BIFET as defined in claim 21, further comprising:

means for preventing a voltage differential of more than a predetermined amount between said first control line and the emitter of said first bipolar transistor.

23. A BIFET logic circuit, for quickly switching an output line from a high level to a low level comprising:

at least two input lines and an output line;

means for driving current into or sinking current out of said output line in accordance with the voltage values on said at least two input lines, said driving means including a bipolar transistor operative, when conductive, to sink current from said output line;

at least one N type FET with its gate connected to one of said input lines for providing current therethrough to the base of said bipolar transistor when parameters of said at least two input lines have a first set of predetermined values;

a power supply;

means for initially providing current from said power supply to said at least one N type FET when said parameters of said at least two input lines have changed to said first set of predetermined values; and resistive means different from said at least one N type FET, in shunt with said current providing means, for connecting one of said source or drain of said at least one N type FET to said power supply to provide a source of base current through said at least one N type FET to said bipolar transistor even after said output line drops in voltage.

24. A BIFET logic circuit as defined in claim 23, wherein said current driving and sinking means comprises an additional bipolar transistor for driving current into said output line when conductive;

a first set of at least two P type FETs for causing said additional bipolar transistor to become conductive when said at least two input lines have a first set of predetermined values;

a second set of at least two N type FETs, including said at least one N type FET, for providing base current to said first mentioned bipolar transistor when said input lines have said first set of predetermined values; and means for preventing said first mentioned bipolar transistor from saturating.

25. A BIFET circuit as defined in claim 24, further comprising:

means for turning off said first-mentioned bipolar transistor when said additional bipolar transistor becomes conductive.

26. A BIFET circuit as defined in claim 25, wherein said turning off means comprises means for preventing a voltage differential of more than a predetermined amount between said first control line and the emitter of said first-mentioned bipolar transistor.

27. A BIFET circuit as defined in claim 26, wherein said preventing means comprises a diode connected across said first-mentioned bipolar transistor base and emitter terminals.

28. A BIFET logic circuit as defined in claim 26, wherein said current driving and sinking means includes a feedback N type FET with its gate connected to the base of said additional bipolar transistor, and with one of its source or drain connected to the base of said first-mentioned bipolar transistor; and means connected between said feedback NFET and a reference potential for preventing said feedback NFET from conducting when said first-mentioned bipolar transistor is conducting.

29. A BIFET logic circuit as defined in claim 28, wherein said first set of PFETs comprises said at least two PFETs connected in a parallel circuit, with one end of said parallel circuit connected to said power supply, and with the other end of said parallel circuit connected to the base of said additional bipolar transistor, with each of said input lines connected to a different PFET gate; and wherein said second set of NFETs comprises said at least two NFETs connected in a series circuit, with one end of said series circuit connected to the base of said additional bipolar transistor, and with the other end of said series circuit connected to the base of said first mentioned bipolar transistor, with each of said input lines connected to a different NFET gate.

30. A BIFET logic circuit as defined in claim 28, wherein said first and second sets of FETs are connected to said input lines to form NOR logic.

* * * * *